United States Patent

[11] 3,603,893

[72] Inventor David Geoffrey Hughes
London, England
[21] Appl. No. 60,536
[22] Filed Aug. 3, 1970
[45] Patented Sept. 7, 1971
[73] Assignee Decca Limited
London, England
[32] Priority Oct. 14, 1969
[33] Great Britain
[31] 50542/69

[54] PHASE LOCKED OSCILLATORS
14 Claims, 3 Drawing Figs.

[52] U.S. Cl. ........ 331/17, 331/8, 332/19
[51] Int. Cl. ........ H03b 3/06
[50] Field of Search ........ 331/8, 17; 332/19

[56] References Cited
UNITED STATES PATENTS
3,290,611 12/1966 Horlacher et al. ............ 331/17

*Primary Examiner*—John Kominski
*Attorney*—Mawhinney & Mawhinney

ABSTRACT: A phase-locked oscillator has an oscillator unit switchable between two frequencies, the switches being controlled by a switching control signal in the form of pulses at a regular repetition rate, said pulses having a duration relative to the repetition period linearly proportional to the amplitude of an integrated phase error signal. The oscillator unit is thus switched regularly between its two frequencies, the relative duration of the operation on each frequency being controlled whereby the mean oscillator frequency is controlled to hold the required phase lock, a high degree of linearity between controlling voltage and average output frequency.

PHASE LOCKED OSCILLATORS

BACKGROUND OF THE INVENTION

1. Field of the Invention

This invention relates to phase-locked oscillators, that is to say oscillators in which the frequency has to be controlled in order to maintain the phase of the oscillator output in a required phase relation with another signal. Such oscillators are used, for example, in many forms of phase comparison radio navigation systems. In such systems, it is often a requirement in a receiver to have an oscillator providing a continuous signal output locked in phase to a received signal which may be available only intermittently or with interruptions, e.g. due to noise.

2. Description of the Prior Art

In a phase-locked oscillator, an error voltage is normally utilized to control the oscillator frequency. This error voltage may be derived from a phase discriminator comparing the phase of the incoming signal with the phase of the oscillator output to produce a discriminator output voltage which is integrated to give this error signal. The integration is necessary since it is required to control the phase of the oscillator output by regulating its frequency. In the presence of high noise conditions, the output from the phase discriminator will fluctuate. If the oscillator frequency control is not linearly proportional to the integral of the phase error, the nonlinearity will produce a false averaging and thus cause a noise-dependent error in the phase lock between the incoming controlling signal and the oscillator output signal. It is usual to apply the error voltage, that is a signal representing the integrated phase error, to a variable reactor circuit which in turn controls the frequency of the oscillator. Linearity is very difficult to obtain with these devices and complex circuits are required. Problems arise in quantity production in that individual units require linearity and frequency range adjustments and checks.

SUMMARY OF THE INVENTION

It is an object of the present invention to provide an improved form of phase-locked oscillator which can readily be made to have a linear relationship between an input controlling voltage and the average output frequency to a high degree of linearity.

According to the present invention, a phase-locked oscillator comprises an oscillator unit switchable between two frequencies, comparison means comparing the phase of the output of the oscillator unit with the phase of an incoming controlling signal and providing an integrated phase error signal, means for producing a switching control signal in the form of pulses at a regular repetition rate, said pulses having a duration relative to the repetition period linearly proportional to the amplitude of the integrated phase error signal, and means for applying said pulses as a switching signal to the oscillator unit to switch that unit between its two frequencies whereby the average oscillator frequency is maintained at the required value to hold the phase lock.

The integrated phase error signal may be produced by conventional techniques; it is readily possible to provide a phase error signal accurately representative of the phase error and also to integrate this signal accurately. Thus a control signal can be provided which is linearly related to the integrated phase error to a high degree of accuracy. In the arrangement of the present invention, this signal is used to control the mark-to-space ratio of switching control pulses for the oscillator unit. Conveniently the repetition ratio of these pulses is kept constant and their duration controlled. This control of mark-to-space ratio may also readily be done to give a linear relation to a high degree of accuracy. Since the oscillator is switched between two frequencies, the average frequency depends directly on the mark-to-space ratio. The problems of linear control of the oscillator frequency are thus now avoided and it thereby becomes possible to obtain a linear relationship between the average oscillator frequency and the control voltage.

It will be noted that the range of control of the average output frequency of the oscillator unit must be between the limits fixed by the two frequencies between which it can be switched. The pulse period must be greater than the cycle period of the oscillator output. This is because the reactance to be switched into the oscillator circuit will be an effective reactance only if its insertion is wattless. A capacitor could be inserted into the circuit and removed at the same phase in the next cycle. An inductance could be coupled in and removed at instants of zero current. The timing is not critical however if the pulse period covers several complete cycles and the effects are negligible if the pulse period exceeds 10 cycles of the oscillator frequency. The lower limit of the switching frequency is also affected by another factor. If the pulse period is long, a large phase shift can occur. The actual magnitude will depend on the frequency shift as well as the switching period. The phase shift must be kept less than say 30°. Small phase shifts moreover are preferable as they will give a smoother output from the integrating amplifier. In practice, the switching frequency is made much greater than the minimum frequency determined by any of these criteria. Typically, the pulse period might be 100 to 1,000 times greater than the oscillator cycle period. The pulse waveform is conveniently rectangular but it would be possible to use a triangular waveform the oscillator frequency being related to the fixed amplitude triangular waveform.

It is convenient to employ rectangular pulses, which vary in duration between a predetermined minimum and a maximum, the maximum necessarily being slightly less than the cycle period of a pulse repetition frequency. These minimum and maximum durations determine the minimum and maximum average frequencies of the oscillator unit.

A number of different arrangements of timing generator are possible for producing a pulse of a duration proportional to a control voltage representing the integrated phase error. For example, a constant current generator may be arranged to charge a capacitor to a voltage proportional to the control voltage, i.e. the integrated phase error signal. The time duration from the start of charging to reaching the required voltage level is thus linearly proportional to the control voltage. In another arrangement, a monostable circuit is employed which is reset by a clock pulse to fix the cycle period. Such a monostable circuit may constitute the pulse generator or may be used for controlling a separate pulse generator operating the switching of the frequency-shifting circuit.

The frequency-shifting circuit may comprise an electronic switch to alter the frequency of an oscillator or a voltage-controlled variable reactor. Conveniently a variable capacity diode is employed to form a switchable capacitance in the oscillator circuit.

DESCRIPTION OF THE PREFERRED EMBODIMENT

Figure 1:
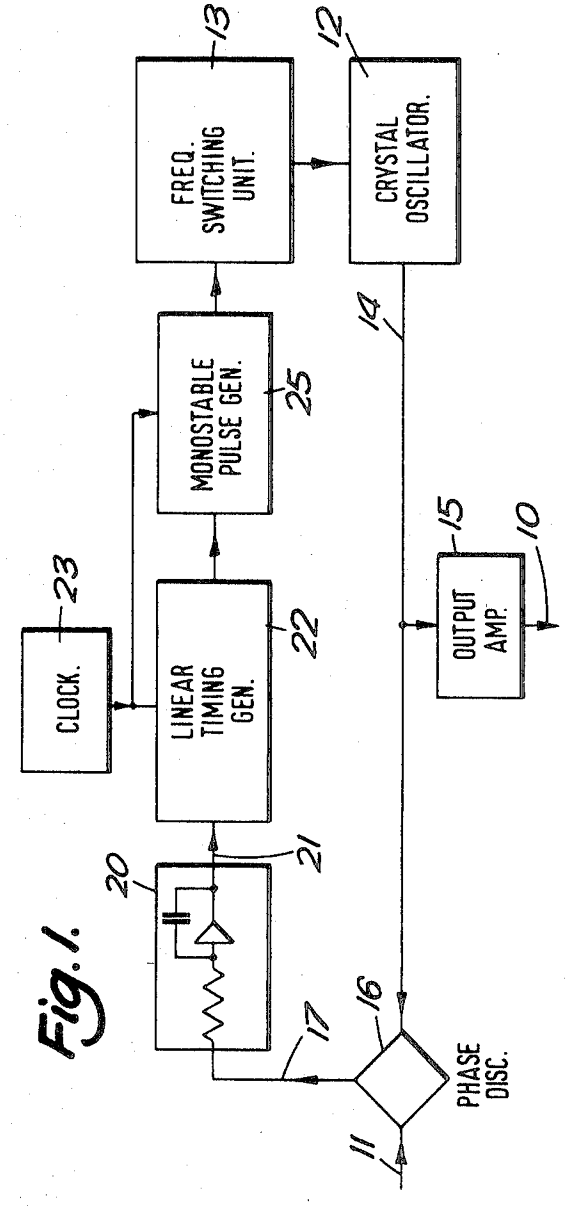
FIG. 1 is a block diagram illustrating a phase-locked oscillator forming one embodiment of the invention.

FIG. 1 shows a phase-locked oscillator for providing an output on a lead 10 locked in phase to an incoming controlling signal on a lead 11. This incoming signal might typically be a received radio frequency signal from a distant transmitter in a phase comparison radio navigation system. An oscillator unit 12, consisting of a stable crystal oscillator, has a switching unit 13 operable to switch the frequency of the oscillator from one value to another. The range of frequency shift must be slightly greater than the maximum range over which the mean frequency of the oscillator unit is to be controlled. Typically, in a phase comparison radio navigation system with a crystal oscillator unit 12, the frequency range over which the control has to be exercised may only be a few Hertz for an oscillator operating at a frequency of, say, 90 kHz. The switching of the frequency of the oscillator between the two values may be effected in a number of ways. Very conveniently a fixed capacitor is employed which can be short circuited by a field effect transistor.

The output from the oscillator unit 12, on a line 14, is fed to the aforementioned output lead 10 by means of an amplifier 15 and it is also fed to a phase discriminator 16 which provides an output signal on a line 17 representative of the phase difference between the output from the oscillator 12 and the incoming signal on lead 11. Many forms of phase discriminators are known which give output voltage accurately proportional to the sine of the phase angle error. Typically the phase discriminator may make use of a short duration pulse obtained from the oscillator output once in each cycle of the signal as the output signal passes through zero amplitude and utilizes this pulse as a gating pulse to gate the incoming signal on lead 11, thereby providing a signal with an amplitude proportional to the sine of the phase angle error. For the few degrees of phase error over which the phase discriminator will have to operate, this sine output may be considered linearly proportional to the phase angle error. This output signal is fed to an integrating unit 20 to provide an integrated phase error voltage in the form of a direct voltage on a lead 21 and this integrated error voltage controls a linear timing generator 22.

The timing generator, in this particular embodiment, comprises a constant current source which charges a capacitor, charging being initiated by a clock pulse from a clock 23 having a repetition frequency typically between 50 and 1,000 Hz. The constant current generator charges the capacitor until the voltage across the capacitor equals that on the lead 21. In another form of timing generator, a capacitor is charged to a fixed voltage by a current which is proportional to the integrated phase error voltage.

The timing generator controls a monostable pulse generator 25 to produce rectangular waveform pulses having a duration proportional to the amplitude of the integrated error signals on lead 21 and having a repetition rate controlled by the clock source. These output pulses are applied to the aforementioned switching unit 13 to switch the oscillator frequency.

Figure 2:
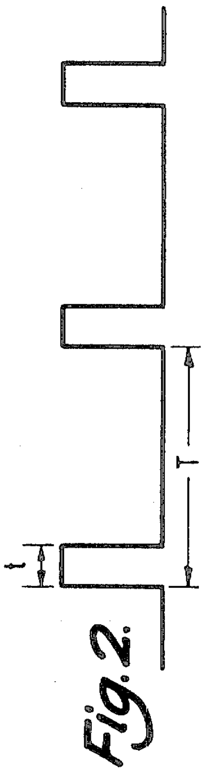
FIG. 2 is a waveform diagram for explaining the switching pulses employed in the arrangement of FIG. 1.

Referring to FIG. 2, the output from the pulse generator is a rectangular waveform of duration *t* and the cycle period is of duration T. In practice, *t* will have a minimum value dependent on circuit consideration and a maximum value which must be less than T. These minimum and maximum durations of the pulses determine the minimum and maximum values of the mean frequency of the oscillator output.

It will be seen that the arrangement as a whole forms a closed-loop servosystem controlling the oscillator frequency so as to maintain an average frequency such that the output is phase locked to the incoming signals on lead 11. Since the range of frequency switching is small and the repetition rate of the frequency switching is quite high, although less than the oscillator output frequency, the phase modulation due to the intermittent switching is negligible. In a typical example, the switching repetition rate might be 1,000 Hz. and the switched frequency shift might be 2 Hz. The zero error or normal duty cycle will be 50 percent, and the average frequency shift 1 Hz. This will result in a phase shift of 1 millicycle each millisecond.

Any noise on the incoming signals on lead 11 will cause fluctuations in the output voltage from the phase discriminator 16. However, because there is no nonlinear relationship between the frequency of the oscillator unit 12 and the integrator phase error signal, these noise peaks do not give a noise dependent error in the average frequency.

If the switching waveform is triangular and that waveform is applied to a voltage-controlled capacity diode, the same shift per cycle or per millisecond can be obtained as with a rectangular waveform. However the peak frequency shift must be greater by a factor of about two. If the frequency shift requirement is not high such a nonuniform phase shift during the switched period is a practical alternative to the fixed rate of shift using a rectangular waveform.

Figure 3:
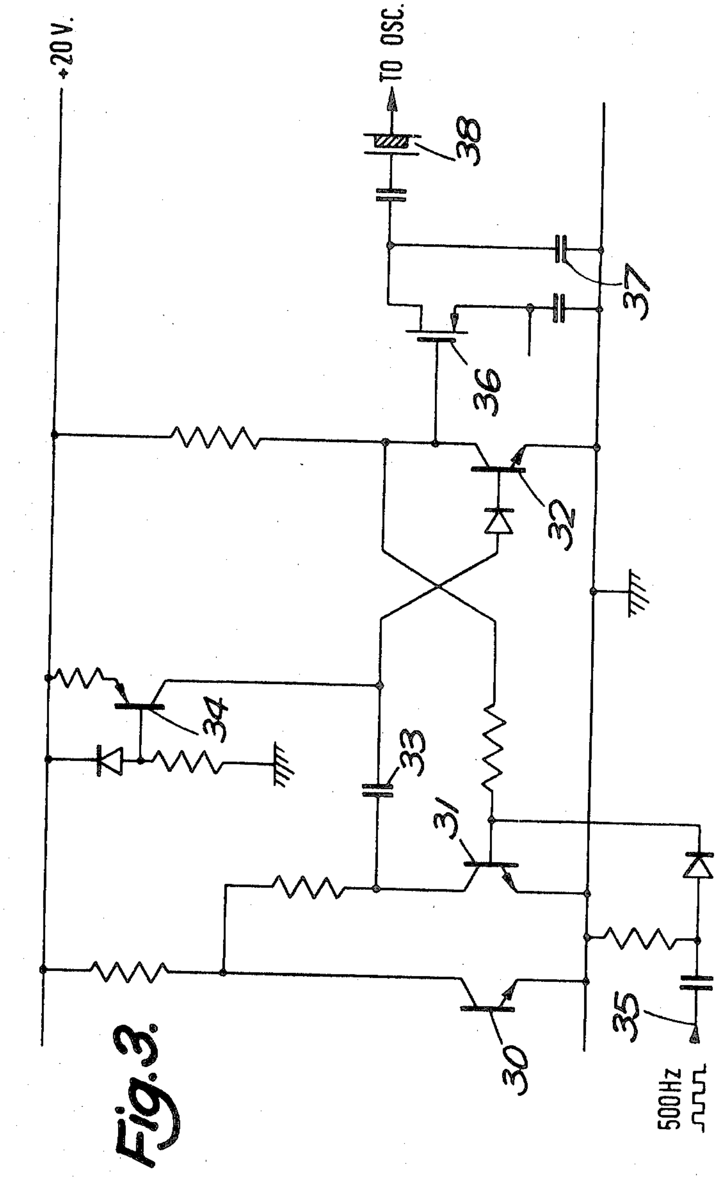
FIG. 3 is a circuit diagram of part of the oscillation of FIG. 1.

FIG. 3 illustrates in further detail part of the phase-locked oscillator of FIG. 1. In FIG. 3 a transistor 30 forms an output stage for the integrator 20 of FIG. 1 and applies the integrated error voltage to a monostable circuit formed by transistors 31 and 32 with a timing circuit including a capacitor 33 and a constant current generator constituted by transistor 34. The monostable in this embodiment is triggered by 500 Hz. clock pulses at an input 35. When the monostable is fired by a clock pulse, the collector voltage of transistor 31 fills by an amount nearly equal to the output voltage from the integrator output stage 30. Thus voltage is transferred through the time constant capacitor 33 and thus the runup of the time constant is proportional to the integrator output. The monostable 31, 32 thus provides a pulse output of controlled duration which is applied to a field effect transistor 36 to form a switching pulse for short circuiting a capacitor 37 in the frequency-controlling circuit of the oscillator unit 12. In FIG. 3, the frequency-controlling crystal of the oscillator unit is shown at 38; the capacitor 37 pulls the frequency of the oscillator by a small amount, typically of the order of 1 part in 20,000.

I claim:

1. A phase-locked oscillator comprising an oscillator unit switchable between two frequencies, comparison means comparing the phase of the output of the oscillator unit with the phase of an incoming controlling signal and providing an integrated phase error signal, means for producing a switching control signal in the form of pulses at a regular repetition rate, said pulses having a duration relative to the repetition period linearly proportional to the amplitude of the integrated phase error signal, and means for applying said pulses as a switching signal to the oscillator unit to switch that unit between its two frequencies whereby the average oscillator frequency is maintained at the required value to hold the phase lock.

2. A phase-locked oscillator as claimed in claim 1 wherein said integrated phase error signal is utilized to control the pulse duration and thereby the mark-to-space ratio of switching control pulses for the oscillator unit, the switching control pulses being at a predetermined constant repetition rate.

3. A phase-locked oscillator as claimed in claim 1 wherein the pulses of the switching control signal have a duration greater than the cycle period of the oscillator output.

4. A phase-locked oscillator unit as claimed in claim 3 wherein the pulse repetition period exceeds 10 cycles of the oscillator frequency.

5. A phase-locked oscillator as claimed in claim 4 wherein the pulse repetition period is between 100 and 1,000 times the oscillator cycle period.

6. A phase-locked oscillator unit as claimed in claim 1 wherein the switching frequency is such that the phase shift during any one switched condition is less than 30°.

7. A phase-locked oscillator as claimed in claim 1 wherein the switching control signal comprises a signal of rectangular pulse waveform.

8. A phase-locked oscillator as claimed in claim 1 wherein said control signal has a triangular waveform.

9. A phase-locked oscillator as claimed in claim 1 wherein the means for producing said switching control signal in the form of pulses proportional to a control voltage comprises a timing generator and a constant current generator arranged to charge a capacitor to a voltage proportional to the integrated phase error signal.

10. A phase-locked oscillator as claimed in claim 1 wherein the means for producing said switching control signal in the form of pulses comprises a monostable circuit which is reset by clock pulses fixing the cycle period.

11. A phase-locked oscillator as claimed in claim 1 wherein, for switching the frequency of the oscillator unit, there is provided a voltage-controlled variable reactor.

12. A phase-locked oscillator as claimed in claim 1 wherein, for switching the frequency of the oscillator unit, there is provided a variable capacity diode forming a switchable capacitance in the oscillator frequency determining circuit.

13. A phase-locked oscillator as claimed in claim 1 wherein, for switching the frequency of the oscillator unit, there is provided an electronic switch for switching a fixed capacitor in the oscillator frequency-determining circuit.

14. A phase-locked oscillator comprising an oscillator unit switchable between two frequencies, the frequency shift being a small fraction of the absolute frequency, comparison means comparing the phase of the output of the oscillator unit with the phase of an incoming controlling signal and providing an integrated phase error signal, means for producing a switching control signal in the form of rectangular pulses at a regular and constant repetition rate greater than the switched frequency shift, the pulse repetition period exceeding 10 cycles of the oscillator frequency, said pulses have a duration relative to the repetition period linearly proportional to the amplitude of the integrated phase error signal, and means for applying said pulses as a switching signal to the oscillator unit to switch that unit between its two frequencies whereby the average oscillator frequency is maintained at the required value to hold the phase lock.